US011385281B2

(12) United States Patent
Qu et al.

(10) Patent No.: US 11,385,281 B2
(45) Date of Patent: *Jul. 12, 2022

(54) HEAT SPREADERS FOR USE IN SEMICONDUCTOR DEVICE TESTING, SUCH AS BURN-IN TESTING (71) Applicant: Micron Technology, Inc., Boise, ID (US)

(72) Inventors: Xiaopeng Qu, Boise, ID (US); Amy R. Griffin, Boise, ID (US); Hyunsuk Chun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

This patent is subject to a terminal disclaimer.

(21) Appl. No.: 16/546,674

(22) Filed: Aug. 21, 2019

(65) Prior Publication Data
US 2021/0055343 A1 Feb. 25, 2021

(51) Int. Cl.
G01R 31/28 (2006.01)
(52) U.S. Cl.
CPC ..... *G01R 31/2877* (2013.01); *G01R 31/2863* (2013.01); *G01R 31/2867* (2013.01); *G01R 31/2875* (2013.01); *G01R 31/2896* (2013.01)
(58) Field of Classification Search
CPC ... H01L 23/34; H01L 23/367; H01L 23/3672; H01L 23/373; H01L 2924/14; H01L 33/62; H01L 23/3677; H01L 21/66; G01R 1/0483; G01R 1/0458; G01R 31/2884; G01R 1/0466; G01R 1/0416; G01R 31/2849; G01R 31/2862; G01R 31/2863; G01R 31/2874; G01R 31/2875; G01R 31/2877;
(Continued)

(56) References Cited

U.S. PATENT DOCUMENTS 5,123,850 A * 6/1992 Elder .................. G01R 1/0483
324/750.05
5,923,179 A * 7/1999 Taylor ................ G01R 1/0458
324/750.1
(Continued)

FOREIGN PATENT DOCUMENTS

WO WO-0213261 A2 * 2/2002 ........... G01R 1/0458

OTHER PUBLICATIONS

U.S. Appl. No. 16/546,648—Unpublished U.S. Patent Application by Xiaopeng Qu et al., filed Aug. 21, 2019, titled "Heat Spreaders for Use in Semiconductor Device Testing, Such as Burn-In Testing", 37 pages.

*Primary Examiner* — Vinh P Nguyen
(74) *Attorney, Agent, or Firm* — Perkins Coie LLP (57) ABSTRACT Heat spreaders for use in semiconductor device testing, such as burn-in testing, are disclosed herein. In one embodiment, a heat spreader is configured to be coupled to a burn-in testing board including a plurality of sockets. The heat spreader includes a base portion and a plurality of protrusions extending from the base portion. When the heat spreader is coupled to the burn-in testing board, the protrusions are configured to extend into corresponding ones of the sockets to thermally contact semiconductor devices positioned within the sockets. The heat spreader can promote a uniform temperature gradient across the burn-in board during testing of the semiconductor devices.

15 Claims, 7 Drawing Sheets (58) Field of Classification Search
CPC .... G01R 31/2896; H05B 3/0071; H05B 7/00;
H05B 7/10; H01R 33/00; H01R 33/74
See application file for complete search history.

(56) References Cited

U.S. PATENT DOCUMENTS

| | | | | |
|---|---|---|---|---|
| 6,213,806 B1* | 4/2001 | Choy | ................... | H05K 7/1069 |
| | | | | 439/331 |
| 6,219,241 B1* | 4/2001 | Jones | ................... | H05K 7/1007 |
| | | | | 361/704 |
| 6,323,665 B1* | 11/2001 | Johnson | ............. | G01R 31/2863 |
| | | | | 324/750.07 |
| 6,744,269 B1* | 6/2004 | Johnson | ............. | G01R 31/2863 |
| | | | | 324/750.09 |
| 7,042,240 B2* | 5/2006 | Lopez | ...................... | G01K 1/16 |
| | | | | 324/750.07 |
| 7,097,488 B2* | 8/2006 | Hayakawa | ........... | G01R 1/0466 |
| | | | | 439/330 |
| 8,564,317 B2* | 10/2013 | Han | ..................... | G01R 1/0458 |
| | | | | 324/750.14 |
| 2005/0146343 A1 | 7/2005 | Wright et al. | | |
| 2005/0206368 A1 | 9/2005 | Lopez et al. | | |
| 2021/0055342 A1 | 2/2021 | Qu et al. | | |

* cited by examiner

HEAT SPREADERS FOR USE IN SEMICONDUCTOR DEVICE TESTING, SUCH AS BURN-IN TESTING

CROSS-REFERENCE TO RELATED APPLICATION(S)

This application contains subject matter related to a concurrently-filed U.S. Patent Application, titled "HEAT SPREADERS FOR USE IN SEMICONDUCTOR DEVICE TESTING, SUCH AS BURN-IN TESTING." The related application, of which the disclosure is incorporated by reference herein, is assigned to Micron Technology, Inc., and is identified by number 010829-9410.US00.

TECHNICAL FIELD

The present technology generally relates to heat spreaders for use during semiconductor device testing, and more particularly relates to heat spreaders configured to be thermally coupled to a plurality of semiconductor devices during burn-in testing.

BACKGROUND

Packaged semiconductor dies—including memory chips, microprocessor chips, MEMs, and imager chips—typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers often test semiconductor packages after or during fabrication to verify the reliability of the packages. One such verification process is burn-in testing, in which some or all of the components of a semiconductor package are exercised prior to being placed in service (and sometimes before the package is fully assembled). In general, burn-in testing includes placing the semiconductor package under an electrical load (e.g., near the operating limits of the package) for a predetermined time and at an elevated temperature (e.g., near a maximum operating temperature of the package). Typically, during a burn-in test, a plurality of semiconductor packages are connected to the sockets of a burn-in board, which provides the electrical load, and the burn-in board is placed in a heated chamber during the test. Those packages that do not function after the burn-in test are scrapped.

BRIEF DESCRIPTION OF THE DRAWINGS

Many aspects of the present technology can be better understood with reference to the following drawings. The components in the drawings are not necessarily to scale. Instead, emphasis is placed on clearly illustrating the principles of the present technology.

DETAILED DESCRIPTION

Specific details of several embodiments of burn-in boards having heat spreaders, and associated systems and methods, are described below with reference to FIGS. 1A-7. In several of the embodiments, a burn-in board includes a plurality of sockets configured to receive semiconductor devices therein during a testing procedure (e.g., a burn-in test). The testing procedure can include heating the burn-in board and the semiconductor devices to a selected test temperature while electrically exercising the semiconductor devices to, for example, weed out faulty devices. A heat spreader is thermally coupled to the semiconductor devices during the testing procedure. The heat spreader can include a base portion and a plurality of protrusions extending from the base portion. The protrusions are configured to extend into corresponding ones of the sockets to thermally contact the semiconductor devices and to thereby thermally couple the semiconductor devices together.

One challenge with burn-in testing is maintaining each of the semiconductor packages connected to the burn-in board at the selected test temperature. Semiconductor packages that are below the selected test temperature (i.e., understressed) can prematurely fail in the field, while semiconductor packages that are above the selected test temperature may exceed their maximum operating temperature, resulting in false failures and destruction of otherwise marketable devices. In one aspect of the present technology, the heat spreader distributes heat among the semiconductor devices during the testing procedure to maintain the semiconductor devices at or near the selected test temperature. In contrast, conventional testing procedures do not include the use of such a heat spreader. Without the heat spreader, the semiconductor devices may be unevenly heated above or below the selected test temperature—increasing the number of false positives (e.g., detected, non-faulty devices) and false negatives (e.g. undetected faulty devices) of the testing procedure.

Numerous specific details of heat spreaders for use in semiconductor device testing, and associated systems and methods, are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-7. For example, some details of semiconductor devices and burn-in testing components well known in the art have been omitted so as not to obscure the present technology. In general, various other devices and systems in addition to those specific embodiments disclosed herein may be within the scope of the present technology.

The term "semiconductor device" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes a semiconductor material. A semiconductor device can include, for example, a semiconductor substrate, wafer, panel, or a single die from a wafer or substrate. A semiconductor device may refer herein to a semiconductor wafer, but semiconductor devices are not limited to semiconductor wafers.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
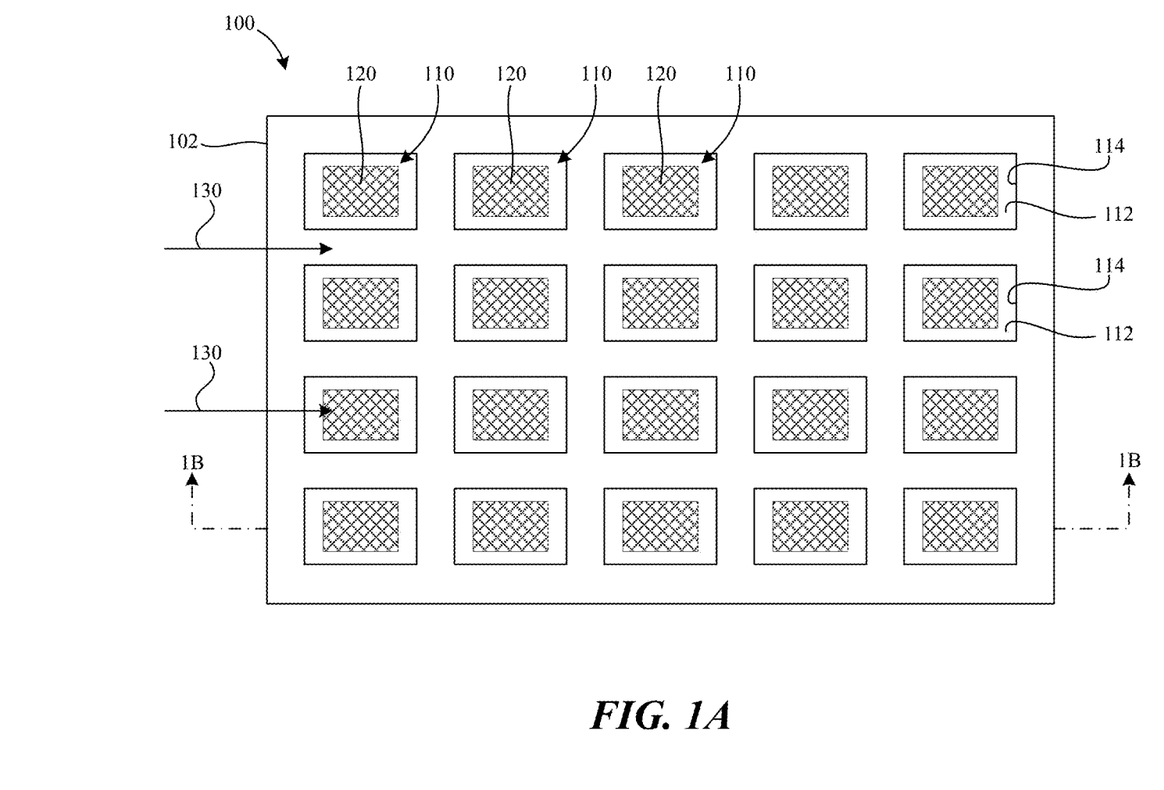
FIG. 1A is a top view of a burn-in board configured in accordance with embodiments of the present technology.
Figure 1B:
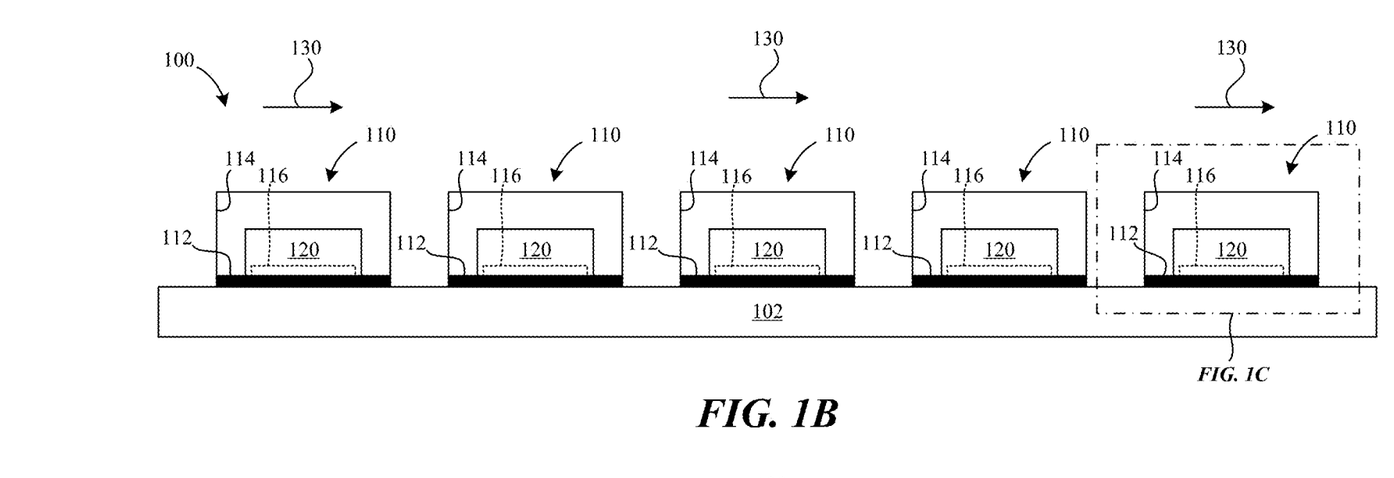
FIG. 1B is a side cross-sectional view of the burn-in board taken along the line 1B-1B in FIG. 1A.
Figure 1C:
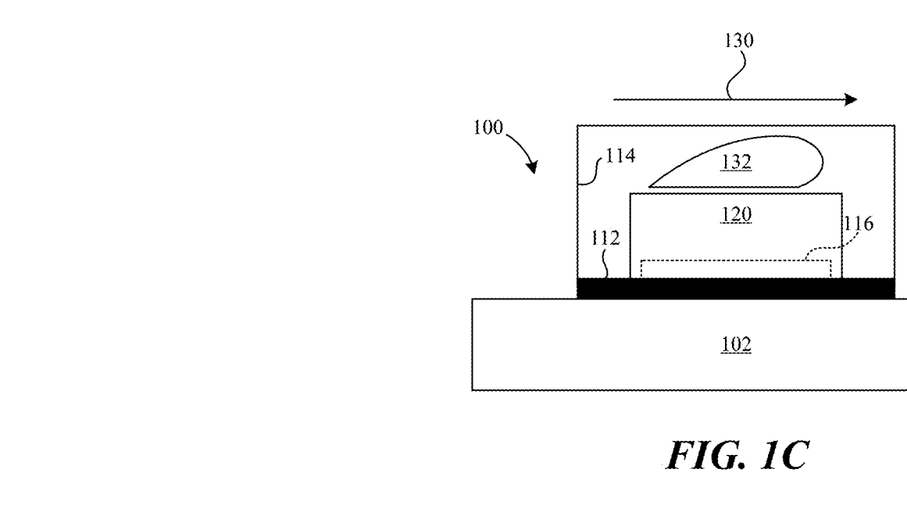
FIG. 1C is an enlarged view of a portion of the burn-in board shown in FIG. 1B.

FIG. 1A is a top view of a burn-in board 100 configured in accordance with embodiments of the present technology. FIG. 1B is a side cross-sectional view of the burn-in board 100 taken along the line 1B-1B in FIG. 1A, and FIG. 1C is an enlarged view of a portion of the burn-in board 100 shown in FIG. 1B. Referring to FIGS. 1A-1C together, the burn-in board 100 includes an electrical substrate 102 and plurality of sockets 110 coupled to the electrical substrate 102. In some embodiments, the electrical substrate 102 can include an electrically-insulating material (e.g., glass, plastic, glass-filled plastic, and/or ceramic) having conductive contacts, traces, etc., disposed in and/or on the electrically-insulating material. For example, in some embodiments the electrical substrate 102 can be a printed circuit board.

Each of the sockets 110 is configured to receive a semiconductor device 120 therein and to electrically couple the semiconductor device 120 to the electrical substrate 102. The semiconductor devices 120 can be semiconductor packages, silicon dies, etc., and can include various memory circuits (e.g., dynamic random memory (DRAM) or other type of memory circuits), controller circuits (e.g., DRAM controller circuits), logic circuits, and/or other circuits. In the illustrated embodiment, the burn-in board 100 includes twenty sockets 110 aligned in rows and columns. In other embodiments, the burn-in board 100 can include any number of sockets 110 (e.g., more or fewer than twenty) that can be arranged in rows and columns, or in another suitable arrangement. Individual ones of the sockets 110 can be spaced apart from and/or abut adjacent ones of the sockets 110. For example, in the illustrated embodiment the sockets 110 are spaced laterally apart from one another in columns and rows (e.g., a grid arrangement) across the electrical substrate 102. Moreover, in the illustrated embodiment each of the sockets 110 and the semiconductor devices 120 are substantially identical. In other embodiments, the configurations of the sockets 110 and semiconductor devices 120 can differ.

Each of the sockets 110 is configured to receive, hold, and facilitate testing of the semiconductor device 120 positioned therein. More particularly, each of the sockets 110 can include a base portion 112 and a sidewall 114 extending from the base portion 112 that together define a recess configured (e.g., sized and shaped) to receive the semiconductor device 120. Each of the sockets 110 can include a mounting seat 116 (shown schematically in FIGS. 1B and 1C) on/in the base portion 112 and having electrical contacts that are configured to contact and electrically couple to corresponding contacts (e.g., leads) of the semiconductor device 120 positioned therein. The mounting seats 116 are configured to electrically couple the semiconductor devices 120 to testing circuitry (not shown) configured to provide power and electrical test signals to the semiconductor devices 120 during a testing procedure, such as a burn-in test. In some embodiments, the electrical contacts of the mounting seats 116 can have moveable contact portions configured to move into and out of electrical engagement with the respective leads of the semiconductor devices 120. For example, the electrical contacts can include electrical clips, conductive traces, and/or double-ended electrical pogo-pins. In other embodiments, the burn-in board 100 can be a socketless burn-in board in which the mounting seats 116 (and/or other components that include the electrical connections necessary to power and communicate with the semiconductor devices 120) are positioned on a surface of the electrical substrate 102.

The burn-in board 100 is configured to be placed within a heating chamber (e.g., a burn-in heating chamber 576 shown in FIG. 5) during a procedure for testing the semiconductor devices 120 to, for example, identify failed or failing ones of the semiconductor devices 120 (e.g., those including manufacturing defects). The heating chamber is configured to heat the semiconductor devices 120 to a selected test temperature, such as a temperature at or near a maximum operating temperature of the semiconductor devices 120. The semiconductor devices 120 can be powered/operated during the test procedure via the testing circuitry. In some embodiments, the heating chamber can be part of a burn-in convection oven having temperature cycling capabilities. In some embodiments, the heating chamber is configured to heat the semiconductor devices 120 via convective heat transfer. In the illustrated embodiment, heated air generated within the heating chamber is passed over the burn-in board 100, as indicated by arrows 130, and circulates around the semiconductor devices 120 to heat the semiconductor devices 120.

However, heat may be irregularly distributed to the semiconductor devices 120 during the testing procedure depending on, for example, the position of the semiconductor devices 120 along the burn-in board 100. For example, air pockets (e.g., an air pocket 132 shown in FIG. 1C) may form within one or more of the sockets 110. Such air pockets can impose a significant thermal resistance by inhibiting the circulation of the heated air around the semiconductor devices 120, thereby causing the semiconductor devices 120 to be below/above the selected test temperature during all or a portion of the testing procedure. Furthermore, heat generated by the semiconductor devices 120 during the testing procedure can propagate to other ones of the semiconductor devices 120. For example, the circulating air can carry the heat from upstream ones of the semiconductor devices 120 to downstream ones of the semiconductor devices 120 (e.g., in the direction of arrows 130). This additional heat transfer can increase the temperature of the downstream semiconductor devices 120 above the selected test temperature, which can affect the performance of the semiconductor devices 120 and potentially cause premature failures and degradation. Premature failures caused by excessive heating of the semiconductor devices 120 above the selected test temperature are false positives identified by the testing procedure.

Figure 2A:
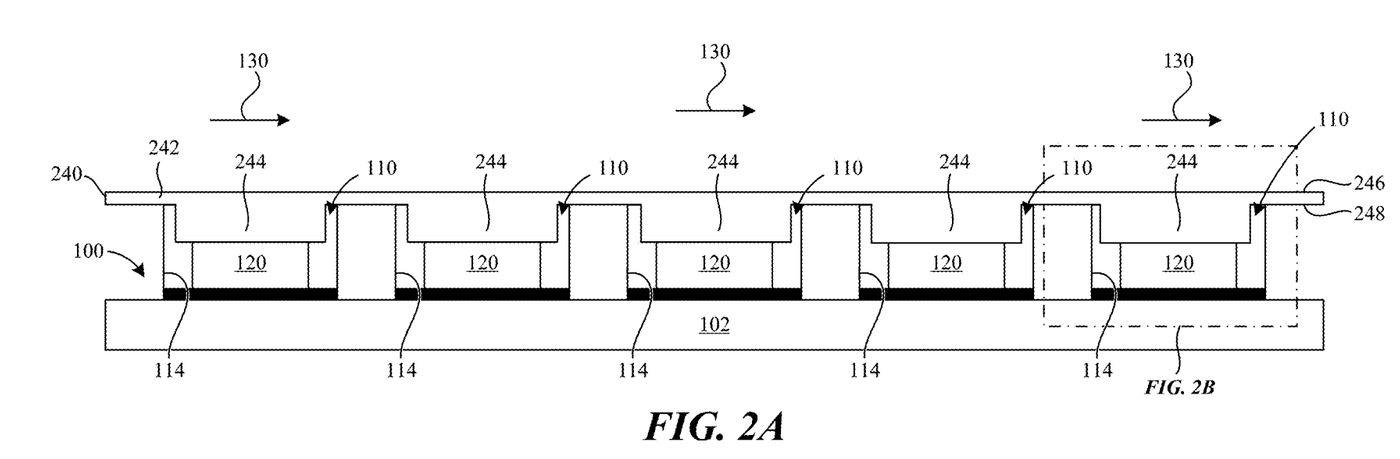
FIG. 2A is a side cross-sectional view of the burn-in board of FIGS. 1A-1C having a heat spreader coupled thereto in accordance with embodiments of the present technology.
Figure 2B:
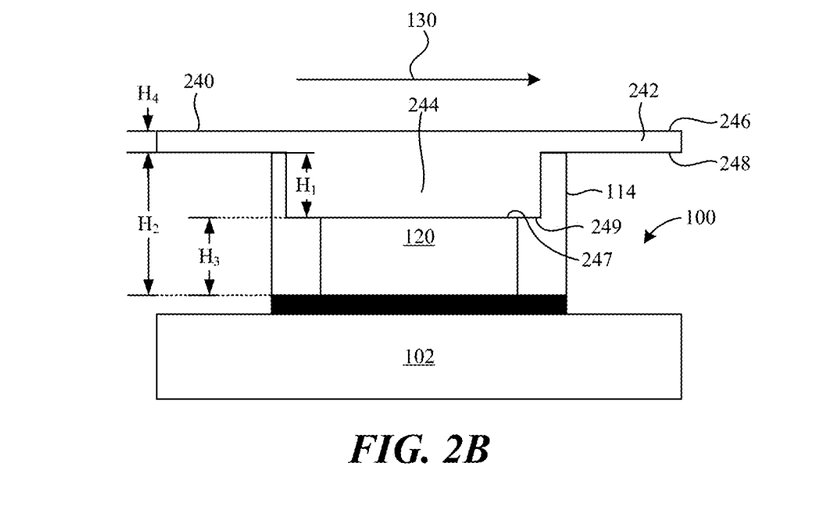
FIG. 2B is an enlarged view of a portion of the burn-in board and the heat spreader shown in FIG. 2A.

FIG. 2A is a side cross-sectional view of the burn-in board 100 of FIGS. 1A-1C having a heat spreader 240 (which can also be referred to as a heat disperser, a heat sink, plate, etc.) coupled thereto in accordance with embodiments of the present technology. FIG. 2B is an enlarged view of a portion of the heat spreader 240 and the burn-in board 100 shown in FIG. 2A. Referring to FIGS. 2A and 2B together, in general, the heat spreader 240 is configured to evenly distribute heat across the burn-in board 100 to the semiconductor devices 120 during a testing procedure using the burn-in board 100 to maintain the semiconductor devices at or near a selected test temperature.

In the illustrated embodiment, the heat spreader 240 includes a base portion 242 and a plurality of protrusions 244 (e.g., contact portions, projections, etc.) projecting from the base portion 242. Each of the protrusions 244 is configured to contact a corresponding one of the semiconductor devices 120. More specifically, the protrusions 244 can project into the sockets 110 such that a lower surface of each protrusion 244 contacts an upper surface of the semiconductor device 120 in the socket 110. That is, the protrusions 244 can be arranged in a pattern (e.g., a grid) corresponding to the placement of the semiconductor devices 120 on the burn-in board 100.

The heat spreader 240 can be a single (e.g., continuous, integral, etc.) structure/piece of heat-conducting material such as, aluminum, copper, etc. In other embodiments, the heat spreader 240 can comprise multiple heat-conducting materials and/or discrete portions/components. For example, each of the protrusions 244 can be a separate thermally-conductive component that is permanently or releasably coupled to the base portion 242. Accordingly, the heat spreader 240 can thermally couple the semiconductor devices 120 together to, for example, promote the even distribution of heat amongst the semiconductor devices 120. In some embodiments, the heat spreader 240 can be formed by milling a single piece of thermally conductive material such as aluminum or copper.

The heat spreader 240 can be configured (e.g., sized and shaped) to cover each of the sockets 110. Accordingly, the heat spreader 240 can have a shape generally corresponding to the dimensions (e.g., width and length) of the burn-in board 100 and/or the arrangement of the sockets 110 positioned thereon. In other embodiments, the heat spreader 240 can cover only a subset of the semiconductor devices 120 on the burn-in board 110 such that the protrusions 244 thermally contact only a subset (e.g., a fixed number of rows or columns) of the semiconductor devices 120, or the illustrated heat spreader 240 can include fewer of the protrusions 244. For example, in some embodiments the heat spreader 240 is configured to cover and/or thermally contact only a subset of the semiconductor devices 120 positioned downstream of the flow of heated air—which are more likely to overheat as described in detail above. In some embodiments, the heat spreader 240 can be sized and shaped based on the dimensions of the heating chamber in which the burn-in board 100 is configured to be placed during a testing procedure. For example, the heat spreader 240 can be sized to abut or contact a portion of the heating chamber. In some embodiments, the heat spreader 240 has the same planform shape as the burn-in board 100 such that the sides of the heat spreader 240 are generally flush with the sides of the burn-in board 100.

In the illustrated embodiment, the base portion 242 of the heat spreader 240 includes an upper surface 246 and a lower surface 248 opposite the upper surface 246. The protrusions 244 generally project downward away from the lower surface 248 of the base portion 242 to contact the semiconductor devices 120. The heat spreader 240 can be supported by the semiconductor devices 120 and/or the sidewalls 114 of the sockets 110. For example, the dimensions of the protrusions 244 and/or the dimensions of the sidewalls 114 of the sockets 110 can be selected such that the weight of the heat spreader 240 is supported by one or some combination of the sockets 110 and the semiconductor devices 120. More particularly, with reference to FIG. 2B, a height $H_1$ (e.g., a thickness, depth, etc.) of each protrusion 244 can be selected based on (i) a height $H_2$ of the sidewall 114 of the corresponding one of the sockets 110 and/or (ii) a height $H_3$ of the semiconductor device 120 therein.

Figure 3:
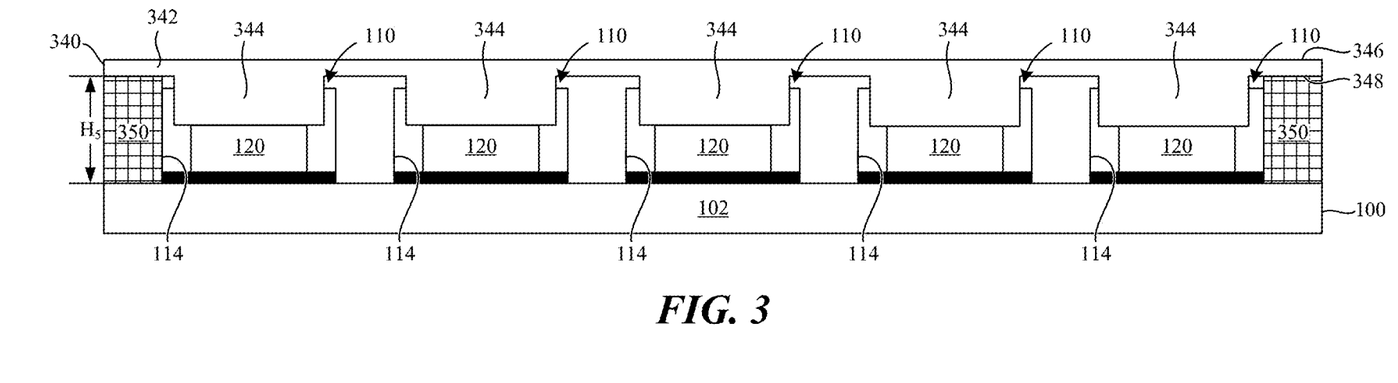
FIG. 3 is a side cross-sectional view of the burn-in board of FIGS. 1A-1C having a heat spreader coupled thereto in accordance with another embodiment of the present technology.
Figure 4:
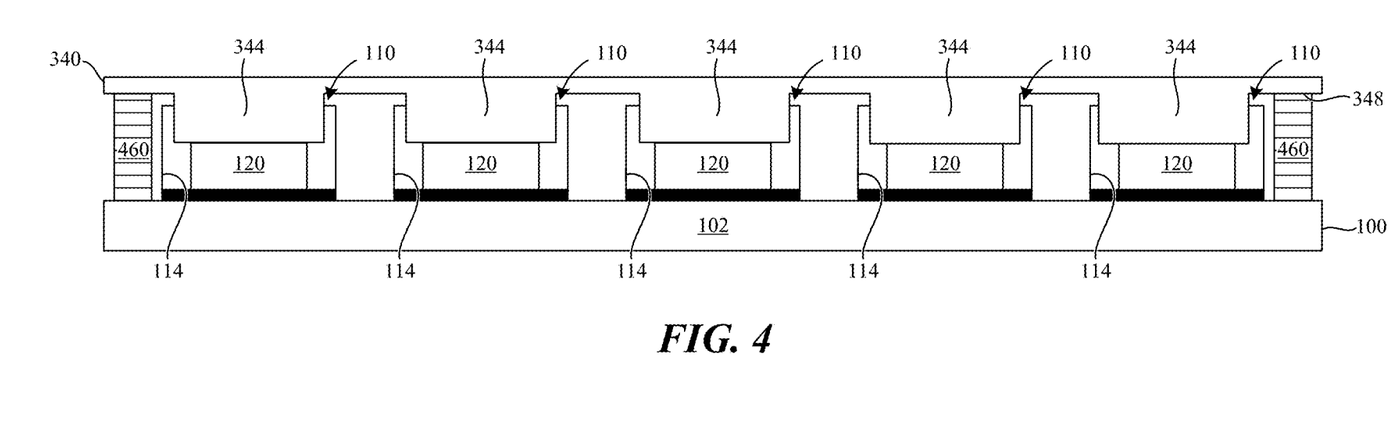
FIG. 4 is a side cross-sectional view of the heat spreader of FIG. 3 coupled to the burn-in board of FIGS. 1A-1C in accordance with another embodiment of the present technology.

In some embodiments, the height $H_1$ is equal to or about equal to the difference between the heights $H_2$ and $H_3$ such that (i) a lower surface 249 of the protrusion 244 thermally contacts an upper surface 247 of the semiconductor device 120 and (ii) most of or substantially all the weight of the heat spreader 240 is supported by the socket 110. In other embodiments, the height $H_1$ is greater than the difference between the heights $H_2$ and $H_3$ such that (i) the lower surface 249 of the protrusion 244 thermally contacts the upper surface 247 of the semiconductor device 120 and (ii) substantially all the weight of the heat spreader 240 is supported by the semiconductor device 120. In some such embodiments, the heat spreader 240 is instead supported by a spring or other support coupled to the burn-in board 100 (e.g., to the electrical substrate 102 as shown in FIGS. 3 and 4) or another attachment point in the heating chamber. In yet other embodiments, the height $H_1$ is less than the difference between the heights $H_2$ and $H_3$ such that (i) the lower surface 249 of the protrusion 244 does not contact the upper surface 247 of the semiconductor device 120 and (ii) substantially all the weight of the heat spreader 240 is supported by the socket 110. In some such embodiments, a thermal interface material, thermal grease, thermally-conductive pad, etc., can be positioned between the semiconductor device 120 and the protrusion 244 and can thermally couple the semiconductor device 120 to the heat spreader 240. In other embodiments, the heat spreader 240 can alternatively or additionally be supported by a clamp, a holder, a shelving of the heating chamber, or another portion of the heating chamber.

In some embodiments, the lower surface 249 of the protrusion 244 is configured (e.g., sized and shaped) to contact all or substantially all the upper surface 247 of the semiconductor device 120. For example, in the illustrated embodiment the lower surface 249 of the protrusion 244 is larger than (e.g., over-sized compared to) the upper surface 247 of the semiconductor device 120. In other embodiments, the lower surface 249 of the protrusion 244 and the upper surface 247 of the semiconductor device 120 can have the same shape and area. In other embodiments, the lower surface 249 of the protrusion 244 can be smaller in at least one dimension than the upper surface 247 of the semiconductor device 120. Moreover, in the illustrated embodiment the lower surface 249 of the protrusion 244 has a generally planar shape. In other embodiments, the lower surface 249 can be contoured (e.g., including one or more recesses, curves, etc.), can include one or more bumps or projections, etc. Additionally, in the illustrated embodiment a height $H_1$ of the protrusion 244 is greater than a height $H_4$ of the base portion 242. In other embodiments, the height $H_4$ can be equal to or greater than the height $H_1$.

Referring again to FIGS. 2A and 2B together, in the illustrated embodiment the protrusions 244 are identical (e.g., all having the same height $H_1$). In other embodiments, the protrusions 244 can have different heights to, for example, accommodate testing of different semiconductor devices 120 and/or the use different sockets 110. In some embodiments, the heat spreader 240 can be heavy enough to provide a robust thermal coupling (e.g., suitable contact) between the protrusions 244 and the semiconductor devices 120 in the sockets 110 without the need for a thermal interface material therebetween. In some embodiments, an additional weight/force (not shown) can be applied to the heat spreader 240 to improve the contact and thermal coupling between the protrusions 244 and the semiconductor devices 120. In some embodiments, the heat spreader 240 is configured to include different portions having different thermal conductivities to, for example, compensate for irregularities of temperature distribution across the burn-in board 100. For example, a downstream portion of the heat spreader 240 can be relatively more thermally conductive than an upstream portion or vis versa. In some embodiments, to achieve the different thermal conductivities, the heat spreader 240 can have varying thicknesses or other dimensions and/or can comprise two or more different thermally conductive materials.

The heat spreader 240 is configured to be installed onto the burn-in board 100 (e.g., before the burn-in board 100 is placed within the heating chamber) for testing the semiconductor devices 120. For example, heat spreader 240 can be lifted and placed onto the burn-in board 100. In some embodiments, the heat spreader 240 is passively secured to the burn-in board 100 while, in other embodiments, the heat spreader 240 is clamped, fastened, or otherwise secured to the burn-in board 100. During a testing procedure, when the heat spreader 240 and the burn-in board 100 are placed within the heating chamber, the heat spreader 240 absorbs/transmits heat to/from the heated air flowing in the direction of arrows 130 and the semiconductor devices 120. For example, the heat spreader 240 can absorb heat from the air and distribute it to the semiconductor devices 120 via the thermal coupling between the protrusions 244 and the semiconductor devices 120 to heat the semiconductor devices 120 to a selected test temperature. At the same time, the heat spreader 240 can absorb, redistribute, and/or dissipate heat from any of the semiconductor devices 120 that are above the selected test temperature. Moreover, because the protrusions 244 extend into the sockets 110 to contact the semiconductor devices 120, the heat spreader 240 can inhibit or even prevent air pockets (e.g., the air pocket 132 shown in FIG. 1B) from forming in the sockets 110. Accordingly, in one aspect of the present technology the heat spreader 240 operates to evenly distribute heat across the burn-in board 100 and the semiconductor devices 120. The heat spreader 240 can therefore help ensure that all of the semiconductor devices 120 are at or near the selected test temperature during the testing procedure, which can reduce the number of false positives (i.e., the identification of semiconductor devices that failed the testing procedure only because they were above the selected test temperature during the testing procedure) and/or false negatives (i.e., the failure to identify faulty semiconductor devices that passed the testing procedure only because they were below the selected test temperature during the testing procedure).

FIG. 3 is a side cross-sectional view of the burn-in board 100 of FIGS. 1A-1C having a heat spreader 340 coupled thereto in accordance with another embodiment of the present technology. The heat spreader 340 can include features generally similar or identical to the features of the heat spreader 240 described in detail with reference to FIGS. 2A and 2B. For example, the heat spreader 340 includes a base portion 342 having an upper surface 346 and a lower surface 348, and a plurality of protrusions 344 projecting from the lower surface 348 into the sockets 110 to thermally contact the semiconductor devices 120.

However, in the illustrated embodiment the heat spreader 340 is supported by a stand 350 (e.g., a support, support member, frame, platform, base, etc.). More particularly, the stand 350 can extend between the lower surface 348 of the base portion 342 and the electrical substrate 102 of the burn-in board 100. In general, the stand 350 can be positioned anywhere between the burn-in board 100 and the heat spreader 340 to fully or partially support the heat spreader 340. In the illustrated embodiment, the stand 350 is positioned around and between an outer periphery of the burn-in board 100 and an outer periphery of the heat spreader 340. The stand 350 can extend around the entire outer peripheries of the burn-in board 100 and the heat spreader 340, or only a portion or portions of the outer peripheries. In some embodiments, the stand 350 can additionally or alternatively be positioned between the sockets 110 and the corresponding protrusions 344 across all or a portion of the burn-in board 100. The stand 350 can comprise any suitably strong material (e.g., metal, plastic, etc.) and can be permanently or releasably attached to the burn-in board 100 and/or the heat spreader 340. In some embodiments, the stand 350 can comprise a portion of the heat spreader 340. In other embodiments, the stand 350 can extend between the heat spreader 340 and a portion of the heating chamber. For example, the heat spreader 340 could be supported by a sidewall of the heating chamber, a rack disposed within the heating chamber, etc.

In the illustrated embodiment, the stand 350 supports the heat spreader 340 above the sockets 110 such that the heat spreader 340 does not rest on the sockets 110 (e.g., such that the heat spreader 340 is spaced apart from the sidewalls 114 of the sockets 110). Accordingly, the protrusions 344 can have a relatively greater height than the protrusions 244 of the heat spreader 240 shown in FIGS. 2A and 2B to facilitate thermal contact between the protrusions 344 and the semiconductor devices 120. In one aspect of the present technology, this arrangement can prevent or relieve pressure on the sockets 110 while still permitting the heat spreader 340 to thermally contact the semiconductor devices 120. In some embodiments, a soft material (e.g., foam) can be positioned between the sockets 110 and the heat spreader 340 to inhibit the heat spreader 340 from damaging or putting excessive pressure on the sockets 110. In some embodiments, a height $H_5$ of the stand 350 can be adjusted to vary a position of the protrusions 344 within the sockets 110 such that, for example, the protrusions 344 thermally contact the semiconductor devices 120. In some embodiments, the stand 350 can be swapped with a different stand (not shown) having a height different than the height $H_5$ to facilitate adjustment based on, for example, the configuration (e.g., height, shape, etc.) of the semiconductor devices 120 to be tested.

FIG. 4 is a side cross-sectional view of the heat spreader 340 of FIG. 3 coupled to the burn-in board 100 of FIGS.

1A-1C in accordance with another embodiment of the present technology. In the illustrated embodiment, the heat spreader 340 is supported by a plurality of springs 460 rather than a stand. More particularly, the springs 460 can extend between the lower surface 348 of the base portion 342 and the electrical substrate 102. The springs 460 can be positioned anywhere between the burn-in board 100 and the heat spreader 340 to fully or partially support the heat spreader 340. For example, in the illustrated embodiment the springs 460 are positioned at and between an outer periphery of the burn-in board 100 and an outer periphery of the heat spreader 340. In some embodiments, the springs 460 can additionally or alternatively be positioned between the sockets 110 and the corresponding protrusions 344 across all or a portion of the burn-in board 100. In other embodiments, the springs 460 can extend between the heat spreader 340 and a portion of the heating chamber. For example, the springs 460 could be coupled between the heat spreader 340 and a sidewall of the heating chamber, a rack disposed within the heating chamber, etc.

The springs 460 can support the heat spreader 340 above the sockets 110 such that (i) the heat spreader 340 does not rest on the sockets 110 (e.g., the sidewalls 114 of the sockets 110) and (ii) the protrusions 344 still thermally contact the semiconductor devices 120. In one aspect of the present technology, the springs 460 are configured to dampen external forces—for example, forces arising when the burn-in board 100 is moved into or from the heating chamber—to inhibit or even prevent the heat spreader 340 from damaging the semiconductor devices 120 while still permitting the heat spreader 340 to thermally contact the semiconductor devices 120. In another aspect of the present technology, the springs 460 can facilitate thermal contact between the heat spreader 340 and the semiconductor devices 120 even where the burn-in board 100 (e.g., the electrical substrate 102) is warped.

Figure 5:
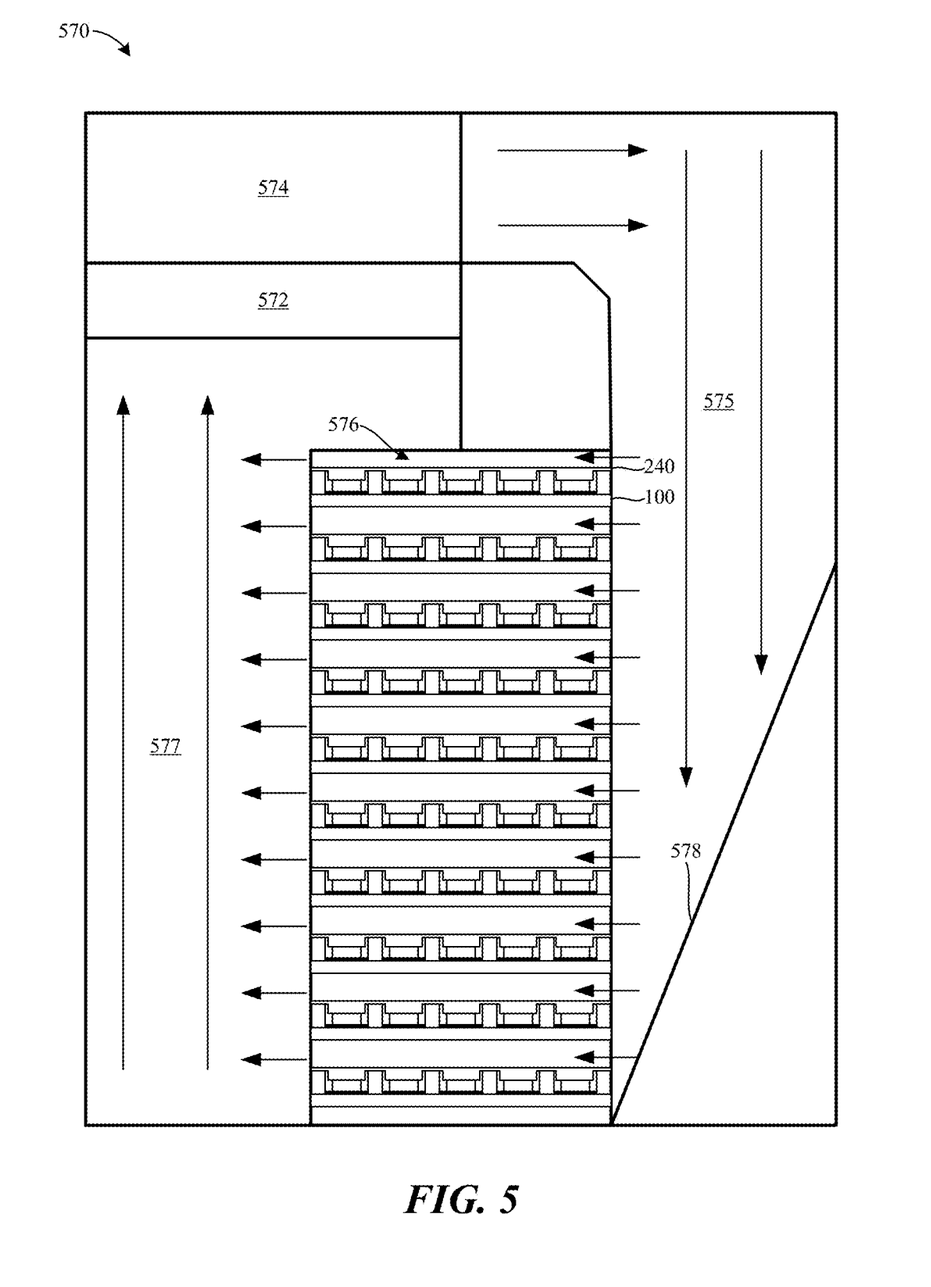
FIG. 5 is a partially schematic, side cross-sectional view of a burn-in test system configured in accordance with embodiments of the present technology.

FIG. 5 is a partially schematic, side cross-sectional view of a burn-in test system 570 ("system 570") configured in accordance with embodiments of the present technology. In the illustrated embodiment, the system 570 is a convection-heating system including a heater 572, a blower or fan 574, an inflow duct 575, a heating chamber 576, and an outflow duct 577. A plurality of the burn-in boards 100 (FIGS. 1A-1C) are positioned within the heating chamber 576 and coupled to corresponding heat spreaders (e.g., the heat spreader 240 shown in FIGS. 2A and 2B). In the illustrated embodiment, the burn-in boards 100 are arranged in a stack and spaced apart from one another. The height $H_4$ of the base portion 242 (FIGS. 2A and 2B) of each of the heat spreaders 240 can be selected such that there is a gap or channel between each of the burn-in boards 100 in the stack. The burn-in boards 100 and coupled heat spreaders 240 can be selectively inserted and removed from the heating chamber 576 to facilitate loading/unloading of the semiconductor devices 120. In some embodiments, the burn-in boards 100 can be inserted into racks in the heating chamber 576 and plugged into corresponding edge connectors (not shown) configured to electrically couple the burn-in boards 100 and the semiconductor devices 120 to external testing circuitry (not shown).

Referring to FIGS. 2A, 2B, and 5 together, in operation during a testing procedure, the system 570 is configured to circulate heated air or other inert gases (e.g., represented by arrows in FIG. 5) past the burn-in boards 100 to heat the semiconductor devices 120 to a selected test temperature. More particularly, the heater 572 is configured to heat the air (e.g., via a resistive heating element, electrical heating element, etc.) and the blower 574 is configured to direct the heated air into the inflow duct 575. In some embodiments, the inflow duct 575 includes a plate 578 (e.g., a kicker plate) configured to guide the heated air from the inflow duct 575 into the heating chamber 576 and past the burn-in boards 100. The plate 578 can be angled relative to the heating chamber 576 to provide a substantially equal rate of air flow across/past the different burn-in boards 100. The heated air then flows through the spaces between the burn-in boards 100 (e.g., over/under/around the burn-in boards 100) to the outflow duct 577, where the air is recirculated to the heater 572. As described in detail above, the heat spreaders 240 thermally couple the semiconductor devices 120 on each of the burn-in boards 100 and operate to evenly distribute heat amongst the semiconductor devices 120 such that the semiconductor devices 120 are maintained at or near the selected test temperature during the duration of the testing procedure.

Figure 6A:
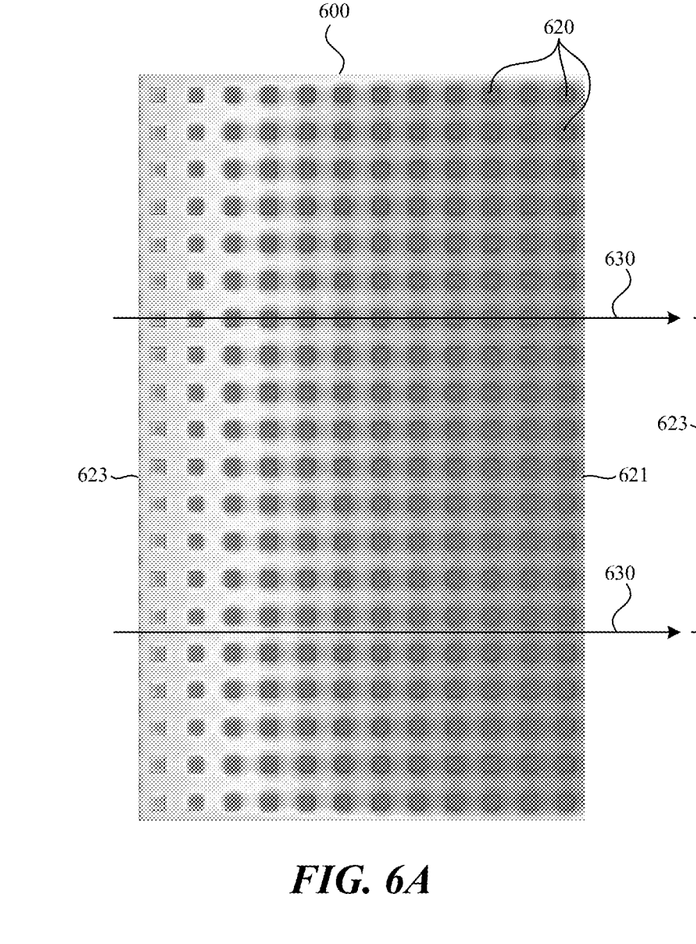
FIG. 6A is a top view of a burn-in board illustrating a temperature distribution across a plurality of semiconductor devices during a burn-in test without a heat spreader coupled to the burn-in board.
Figure 6B:
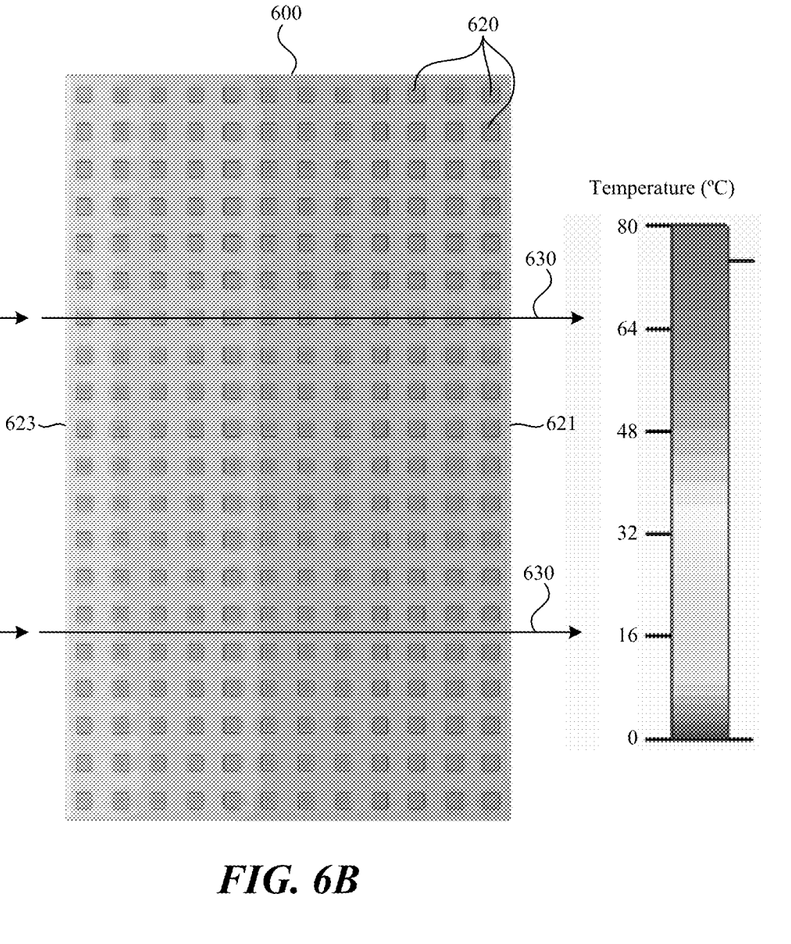
FIG. 6B is a top view of the burn-in board illustrating the temperature distribution across the plurality of semiconductor devices during a burn-in test with a heat spreader coupled to the burn-in board.

FIG. 6A is a top view of a burn-in board 600 illustrating a temperature distribution across a plurality of semiconductor devices 620 during a burn-in test without a heat spreader coupled to the burn-in board 600. FIG. 6B is a top view of the burn-in board 600 illustrating the temperature distribution across the plurality of semiconductor devices 620 during a burn-in test with a heat spreader (e.g., one the heat spreaders 240, 340, or 440) coupled to the burn-in board 600. Referring to FIGS. 6A and 6B together, heated air passes over the burn-in board 600 in the direction indicated by arrows 630 (e.g., as the air travels through the heating chamber 576 from the inflow duct 575 to the outflow duct 577 shown in FIG. 5).

Referring to FIG. 6A, without the heat spreader, the temperature of the semiconductor devices 620 has as a significant gradient that generally increases in the direction of air flow such that the temperature of downstream ones of the semiconductor devices 620 is significantly hotter than the temperature of upstream ones of the semiconductor devices 620. That is, the temperature of the semiconductor devices 620 proximate a downstream side 621 of the burn-in board 600 can be significantly hotter than a temperature of the semiconductor devices 620 proximate an opposing upstream side 623 of the burn-in board 600. Referring to FIG. 6B, with the heat spreader thermally coupled to the semiconductor devices 620, the temperature gradient across the burn-in board 600 (e.g., between the sides 621, 623) can be generally uniform, or at least significantly less than the temperature gradient without the heat spreader (FIG. 6A). Accordingly, the heat spreaders of the present technology can significantly improve the temperature uniformity across the burn-in board 600 and can maintain the semiconductor devices 620 at or near a selected test temperature.

Figure 7:
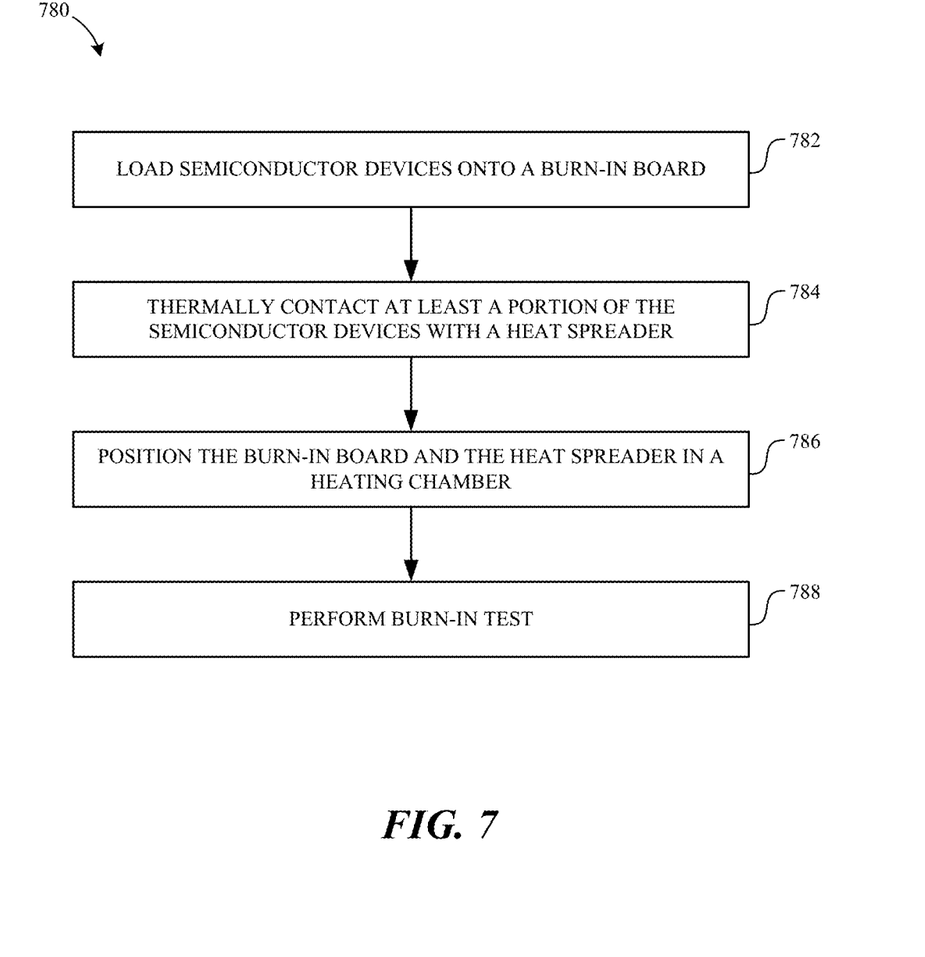
FIG. 7 is a flow diagram of a process or method for performing a burn-in test in accordance with embodiments of the present technology.

FIG. 7 is a flow diagram of a process or method 780 for performing a burn-in test in accordance with embodiments of the present technology. The method 780 can be implemented, for example, using the burn-in board 100, the heat spreader 240 (or the heat spreader 340, the heat spreader 440, etc.), and/or the system 570 described in detail above with reference to FIGS. 1A-5. Accordingly, for the sake of illustration, some features of the method 780 will be described in the context of the embodiments shown in FIGS. 1A-5.

Beginning at block 782, the method 780 includes loading the semiconductor devices 120 onto the burn-in board 100. For example, the semiconductor devices 120 can be electrically coupled to the mounting seats 116 in the sockets 110. At block 784, the method 780 includes thermally contacting at least a portion (e.g., a subset) of the semiconductor devices 120 with the heat spreader 240. For example, the heat spreader 240 can be placed over the burn-in board 100 such that the protrusions 244 of the heat spreader 240 project into the sockets 110 to thermally contact the semiconductor devices 120. In some embodiments, the heat spreader can be positioned on a spring or stand (e.g., the stand 350 and/or the springs 460 illustrated in FIGS. 3 and 4, respectively). In some embodiments, each of the semiconductor devices 120 loaded on the burn-in board 100 at least partially contacts a respective protrusion 244 of the heat spreader 240.

At block 786, the method includes positioning the burn-in board 100 and the heat spreader 240 in a heating chamber (e.g., the heating chamber 576 of the system 570). For example, the burn-in board 100 can be positioned on a rack or other support within the heating chamber 576 and electrically coupled to testing circuitry. At block 788, the method includes performing a burn-in test. For example, the heating chamber 576 can be heated to a selected test temperature for a predetermined amount of time while the semiconductor devices 120 are electrically activated, exercised, cycled, biased, etc. More specifically, the heater 572 of the system 570 can heat the air and the blower 574 can direct the heated air into the inflow duct 575 and to the plate 578, which guides the heated air from the inflow duct 575 into the heating chamber 576 to heat the semiconductor devices 120 on the burn-in board 100.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A heat spreader configured to be coupled to a burn-in testing board including a plurality of sockets, the heat spreader comprising:
   a base portion;
   multiple springs coupled to the base portion; and
   a plurality of protrusions extending from the base portion, wherein, when the heat spreader is coupled to the burn-in testing board
      the protrusions are configured to (a) extend into corresponding ones of the sockets and (b) thermally contact corresponding ones of a plurality of semiconductor devices positioned within the sockets; and
      the springs are configured to extend between the burn-in testing board and the base portion outside the sockets to support the base portion above the sockets.

2. The heat spreader of claim 1 wherein individual ones of the protrusions include a lower surface configured to contact an upper surface of the corresponding one of the semiconductor devices.

3. The heat spreader of claim 2 wherein the lower surface has substantially the same surface area as the upper surface.

4. The heat spreader of claim 2 wherein the lower surface has substantially the same shape as the upper surface.

5. The heat spreader of claim 1 wherein the base portion is a continuous metal structure.

6. The heat spreader of claim 1 wherein the protrusions are releasably coupled to the base portion of the heat spreader.

7. The heat spreader of claim 1 wherein the base portion has thickness that is less than a thickness of individual ones of the protrusions.

8. A heat spreader configured to be coupled to a burn-in testing board including a plurality of sockets, the heat spreader comprising:
   a base portion;
   multiple springs coupled to the base portion; and
   a plurality of protrusions extending from the base portion, wherein individual ones of the protrusions include a lower surface, wherein, when the heat spreader is coupled to the burn-in testing board, (a) individual ones of the protrusions are configured to extend into corresponding ones of the sockets such that the lower surface thermally contacts an upper surface of a corresponding one of a plurality of semiconductor devices positioned within the sockets and (b) the springs are configured to contact the burn-in testing board outside the sockets to support the base portion above the sockets, and wherein the lower surface has a larger surface area than the upper surface.

9. A method of testing a plurality of semiconductor devices, the method comprising:
   electrically coupling the semiconductor devices within corresponding sockets of a burn-in board;
   thermally coupling each of the plurality of semiconductor devices to a common heat spreader having a base portion and a plurality of protrusions extending from the base portion;
   supporting the heat spreader on a plurality of springs extending between the heat spreader and the burn-in board outside the sockets such that base portion is positioned above the sockets; and
   heating the semiconductor devices.

10. The method of claim 9 wherein thermally coupling each of the plurality of semiconductor devices to the heat spreader includes contacting each of the semiconductor devices with a corresponding one of the protrusions of the heat spreader.

11. The method of claim 10 wherein thermally coupling each of the plurality semiconductor devices to the heat spreader includes contacting an upper surface of each of the semiconductor devices with a corresponding lower surface of the corresponding one of the plurality of protrusions, and wherein the lower surface has a larger surface area than the upper surface.

12. The method of claim 9 wherein heating the semiconductor devices includes heating the semiconductor devices to a selected test temperature, wherein the heat spreader is configured to distribute heat amongst the semiconductor devices to maintain the semiconductor devices at the selected test temperature.

13. The method of claim 9 wherein thermally coupling each of the plurality of semiconductor devices to the heat spreader includes positioning the heat spreader over the sockets.

14. A system for use in testing a plurality of semiconductor devices, the system including:

a burn-in board including a plurality of sockets, wherein the sockets are configured to receive corresponding ones of the semiconductor devices therein; and a heat spreader including a base portion and a plurality of protrusions extending from the base portion, wherein the protrusions are sized and shaped to extend into corresponding ones of the sockets to thermally contact corresponding ones of the semiconductor devices when the heat spreader is coupled to the burn-in board; and multiple springs coupled to the heat spreader, wherein the springs are configured to extend between the burn-in testing board and the heat spreader outside the sockets to support the base portion above the sockets when the heat spreader is coupled to the burn-in board.

15. The system of claim 14 wherein individual ones of the protrusions include a lower surface configured to contact an upper surface of the corresponding one of the semiconductor devices, and wherein the lower surface has a larger surface area than the upper surface.

* * * * *